(12) United States Patent
Blanchard

(10) Patent No.: US 8,679,903 B2
(45) Date of Patent: Mar. 25, 2014

(54) VERTICAL QUADRUPLE CONDUCTION CHANNEL INSULATED GATE TRANSISTOR

(75) Inventor: Richard A. Blanchard, Los Altos, CA (US)

(73) Assignee: STMicroelectronics, Inc., Coppell, TX (US)

( * ) Notice: Subject to any disclaimer, the term of this patent is extended or adjusted under 35 U.S.C. 154(b) by 1237 days.

(21) Appl. No.: 11/829,514

(22) Filed: Jul. 27, 2007

(65) Prior Publication Data

US 2009/0029513 A1    Jan. 29, 2009

(51) Int. Cl.
H01L 21/00 (2006.01)
H01L 21/84 (2006.01)
H01L 21/8238 (2006.01)

(52) U.S. Cl.
USPC .......... 438/156; 438/137; 438/192; 438/206; 438/212; 438/268; 438/405; 438/413; 438/423; 257/135; 257/242; 257/329; 257/E29.118; 257/E29.262

(58) Field of Classification Search
USPC .......... 438/74, 137, 138, 156, 192, 206, 212, 438/268, 404, 405, 413, 416, 418, 423, 438/FOR. 176, FOR. 192, FOR. 224; 257/135, 220, 242, 328, 329, E29.118, 257/E29.131, E29.257, E29.26, E29.262, 257/E21.41
See application file for complete search history.

(56) References Cited

U.S. PATENT DOCUMENTS

| | | | |
|---|---|---|---|
| 6,291,845 B1 | 9/2001 | Blanchard | |
| 6,746,923 B2 | 6/2004 | Skotnicki et al. | |
| 6,861,684 B2 | 3/2005 | Skotnicki et al. | |
| 7,078,764 B2 * | 7/2006 | Skotnicki et al. | 257/329 |
| 2004/0266112 A1 * | 12/2004 | Skotnicki et al. | 438/268 |
| 2007/0211523 A1 * | 9/2007 | Kim | 365/158 |
| 2007/0228473 A1 * | 10/2007 | Boyd et al. | 257/353 |

OTHER PUBLICATIONS

Venables, et al., "Low-dislocation-density silicon-on-insulator material produced by sequential oxygen implantation and low-temperature annealing," Appl. Phys. Lett. 60 (25), Jun. 22, 1992, pp. 3147-3149.

* cited by examiner

Primary Examiner — Alexander Sofocleous
Assistant Examiner — Joannie A Garcia

(57) ABSTRACT

A method is provided for fabricating a vertical insulated gate transistor. A horizontal isolation region is formed in a substrate to separate and electrically isolate upper and lower portions of the substrate. A vertical semiconductor pillar with one or more flanks and a cavity is formed so as to rest on the upper portion, and a dielectrically isolated gate is formed so as to include an internal portion within the cavity and an external portion resting on the flanks and on the upper portion. One or more internal walls of the cavity are coated with an isolating layer and the cavity is filled with a gate material so as to form the internal portion of the gate within the cavity and the external portion of the gate that rests on the flanks, and to form two connecting semiconductor regions extending between source and drain regions of the transistor.

21 Claims, 9 Drawing Sheets

VERTICAL QUADRUPLE CONDUCTION CHANNEL INSULATED GATE TRANSISTOR

FIELD OF THE INVENTION

The present invention generally relates to the field of integrated circuits, and more particularly to vertical insulated gate transistors.

BACKGROUND OF THE INVENTION

A vertical insulated gate transistor is a device that overcomes many limitations of a planar MOS transistor, particularly those with lengths less than 0.1 micron. The channel region of a vertical transistor is formed in a silicon pillar that has gate insulator and a gate on its sides. The vertical insulated gate transistor is a technological platform that is particularly suitable for implementing a coating gate architecture with ultra short dimensions, because the channel length in the vertical insulated gate transistor is not fixed by the photolithographic resolution as it is with a planar MOS transistor. It is therefore possible to form channels in a vertical transistor with very small dimensions using standard photolithographic equipment. Also, coating a projecting silicon pillar with a gate is much simpler than coating a thin silicon film buried in a substrate, as is found in planar MOS transistors.

Vertical transistors have a single substrate that acts as the source. One exemplary vertical transistor is described in commonly assigned U.S. Pat. No. 6,746,923, which is incorporated herein by reference. This patent describes a method of fabricating a vertical quadruple conductive channel insulated gate transistor. The resulting structure may not have a source region that is electrically isolated from the substrate, depending on the conductivity types of the source and the substrate. If the substrate is p-type (or if the substrate contains a p-type well) and the source is n-type (or vice versa), the structure is compatible with most circuits.

However, there are other applications in which it is desirable to have the source and the body of the transistor electrically isolated. This is particularly true with stacked devices, such as totem pole or H-bridge transistor configurations, because isolation between components in a circuit is both advantageous and desired. For instance, stacked devices with source and body electrically isolated are better suited for high-frequency analog applications and applications in which electromagnetic pulses (EMPs), which are broadband, high-intensity, short-duration bursts of electromagnetic energy, are anticipated. Another example of applications in which immunity between communication channels is important is in photo-detector applications.

SUMMARY OF THE INVENTION

One embodiment of the present invention provides a method of fabricating a vertical insulated gate transistor on a semiconductor substrate. According to the method, a horizontal isolation region is formed in the semiconductor substrate. This horizontal isolation region separates and electrically isolates an upper portion of the semiconductor substrate from a lower portion of the semiconductor substrate. A vertical semiconductor pillar with one or more flanks and a cavity is formed so as to rest on the upper portion of the semiconductor substrate, and a dielectrically isolated gate is formed so as to include an internal portion within the cavity and an external portion resting on the flanks of the pillar and on the upper portion of the semiconductor substrate. In the formation of the gate, one or more internal walls of the cavity are coated with an isolating layer and the cavity is filled with a gate material so as to form the internal portion of the gate within the cavity and the external portion of the gate that rests on the flanks of the pillar, and to form two connecting semiconductor regions extending between a source region and a drain region of the transistor.

Another embodiment of the present invention provides an integrated circuit that includes at least one vertical insulated gate transistor formed on a semiconductor substrate. The transistor includes a semiconductor substrate, a horizontal isolation region located in the semiconductor substrate and separating and electrically isolating an upper portion of the semiconductor substrate from a lower portion of the semiconductor substrate, a vertical pillar with one or more flanks, a gate dielectric layer situated on the flanks of the pillar and on the upper portion of the semiconductor substrate, and a dielectrically isolated gate. One of a source and drain region is located in the upper portion of the pillar and the other of the source and drain region is located in the lower portion of the pillar. The gate includes an internal portion within the central portion of the pillar and an external portion resting on the flanks of the pillar and on the upper portion of the semiconductor substrate. The internal portion of the gate is laterally separated from the external portion by two connecting semiconductor regions that extend between the source region and the drain region.

DETAILED DESCRIPTION OF PREFERRED EMBODIMENTS

Figure 1:
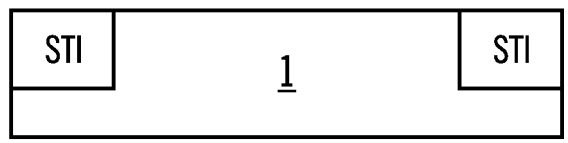
FIGS. 1 to 22 show a method for fabricating a transistor according to one embodiment of the present invention.

Detailed embodiments of the present invention are disclosed herein; however, it is to be understood that the disclosed embodiments are merely exemplary of the invention, which can be embodied in various forms as described in the non-limiting exemplary embodiments. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting, but rather to provide an understandable description of the invention. In the drawings, like reference numerals refer to like features through the several views.

FIG. 1 shows a semiconductor, for example silicon, substrate 1 including lateral isolation areas STI preferably formed using the shallow trench isolation technique. The lateral isolation areas STI delimit an active substrate area in and on which the vertical transistor will be formed. At this stage of the process, insulating wells are also implanted in the substrate 1. The insulating wells are not shown in FIG. 1 for simplicity.

Figure 2:
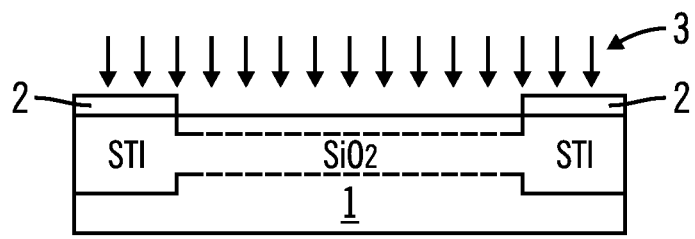

A layer of photoresist 2 is applied to the wafer and patterned, as shown in FIG. 2. Next, oxygen 3 is implanted in the silicon 1 with a sufficiently high dose and energy to form a layer of silicon dioxide ($SiO_2$) in the regions not protected by the photoresist (e.g., active substrate area). In other embodiments, nitrogen or another substance that is able to combine with the silicon 1 to form a dielectric is implanted or otherwise introduced into the silicon 1.

Figure 3:
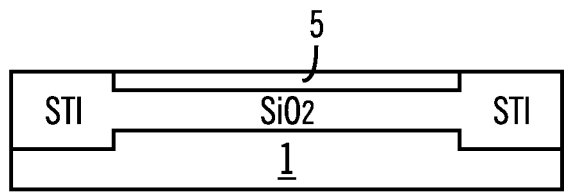

Next, the structure is subjected to an anneal that may range from a relatively short, low-temperature anneal (e.g., 900° C.

for 30 minutes) to a relatively long, high-temperature anneal (e.g., 1100° C. for 6 hours) to recrystallize an upper portion of the silicon layer so as to create a layer of silicon 5 above the underlying (i.e., buried) $SiO_2$ layer, as shown in FIG. 3. The buried $SiO_2$ layer is a horizontal isolation region that completely spans the active substrate area (i.e., from one STI region to the opposite STI region in the cross-section of FIG. 3). This horizontal isolation region separates and electrically isolates the lower silicon portion 1 of the substrate from the upper silicon portion 5 of the substrate. As a non-limiting example, in this embodiment the thickness of each of the $SiO_2$ layer and the upper silicon layer 5 is from 50 nm to 500 nm. Generally, the $SiO_2$ layer is made as thick as practical to minimize the capacitance.

Thus, the resulting structure has upper silicon region 5 that is single crystal silicon surrounded on its sides by STI oxide and on its bottom by the layer of dielectric formed by the implantation and anneal. A device that is isolated from the substrate can now be fabricated on the surface of this isolated upper silicon region 5 (e.g., by forming epitaxial layers on the isolated upper silicon region 5). In preferred embodiments, only selected regions of the substrate are converted to $SiO_2$ through the above process in order to allow devices that are not isolated to be formed on other regions of the substrate.

In further embodiments, the isolated upper layer of single crystal silicon is formed using other fabrication processes. For example, in one alternative embodiment the epitaxial lateral overgrowth (ELO) technique is combined with an etching step that removes any electrical connections between the substrate and a region of the deposited single crystal silicon.

Exemplary annealing processes are described in U.S. Pat. No. 6,291,845, entitled "Fully-Dielectric-Isolated FET Technology," and in Venables et al., "Low-Dislocation-Density Silicon-On-Insulator Material Produced by Sequential Oxygen Implantation and Low-Temperature Annealing" (60 Applied Physics Letters 3147 9, 1992), which are both incorporated herein by reference.

Figure 4:
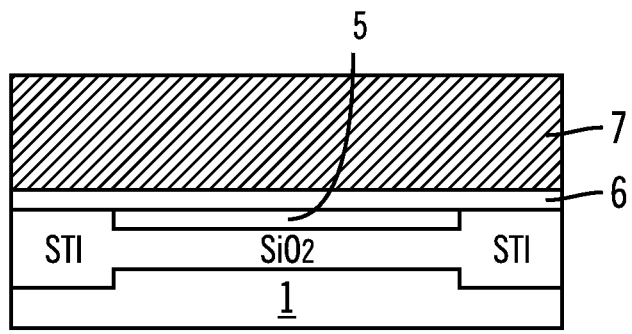
Figure 5:
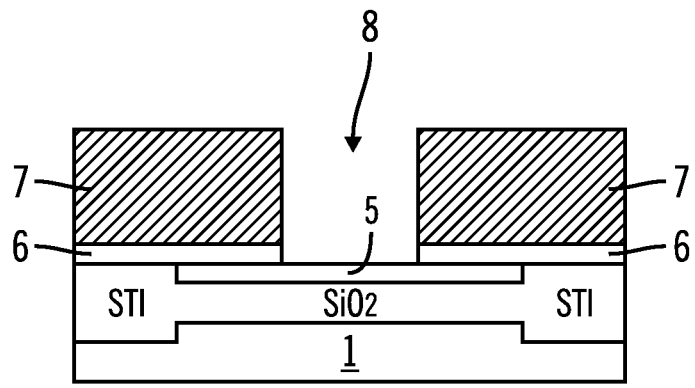

The photoresist 2 is removed and a dielectric block formed of a layer of oxide 6, for example of silicon dioxide, and a silicon nitride layer 7 is deposited onto the structure, as shown in FIG. 4. The dielectric block formed of the dual layers 6 and 7 is then opened by anisotropic etching, stopping at the upper silicon layer 5, as shown in FIG. 5. This forms a window 8 in the dielectric block opening onto the top surface of the upper silicon layer 5.

Figure 6:
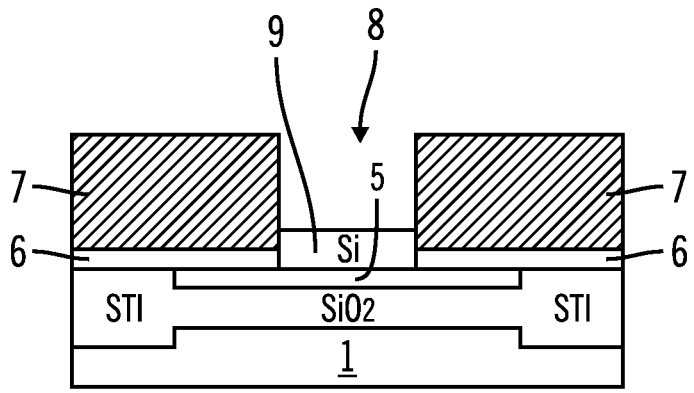
Figure 7:
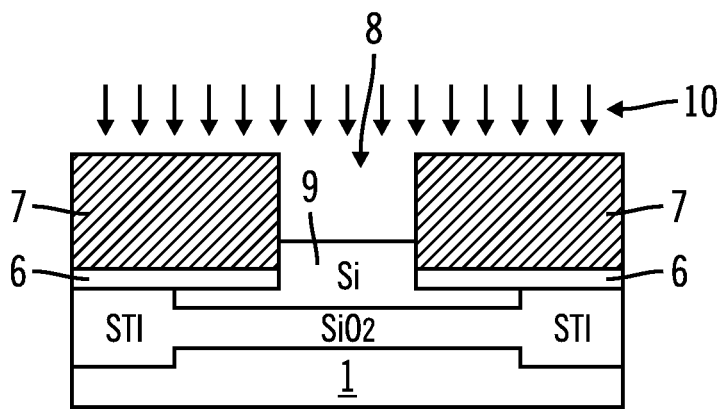

A first silicon layer 9 is then formed in the window 8 by selective epitaxial growth, as shown in FIG. 6. Then, as shown in FIG. 7, implantation using a high dose of arsenic or phosphorus 10 (for the exemplary n-channel transistor) is performed through the window 8 so as to dope the layer 9 that will form the source region S in the bottom part of the pillar of the vertical transistor. The implantation is followed by conventional annealing. Alternatively, the first silicon layer 9 could be doped in situ. As shown, there is electrical isolation between the first silicon layer 9 and the substrate 1 that lies below the $SiO_2$ layer.

Figure 8:
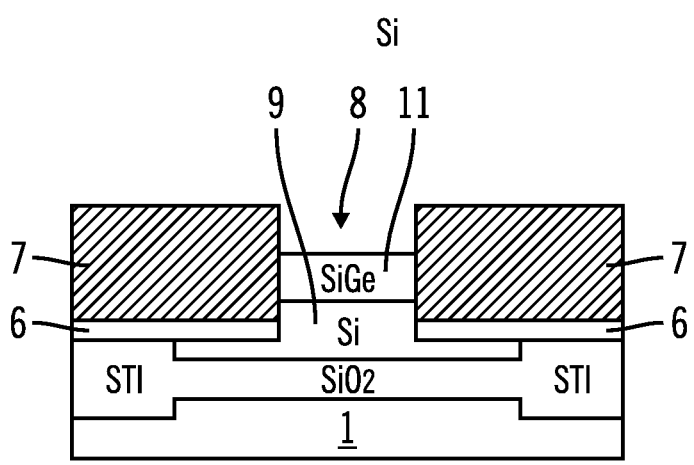

Then, as shown in FIG. 8, a layer 11 of silicon or of a silicon-germanium alloy is formed in the window 8 on the first silicon layer 9 by selective epitaxial growth. The percentage of germanium in the layer 11 is preferably from 15% to 40%. A small percentage of carbon can also be added, which does not compromise selective etching of the material with respect to silicon, but does provide improved lattice continuity between the silicon and the silicon-germanium alloy.

Figure 9:
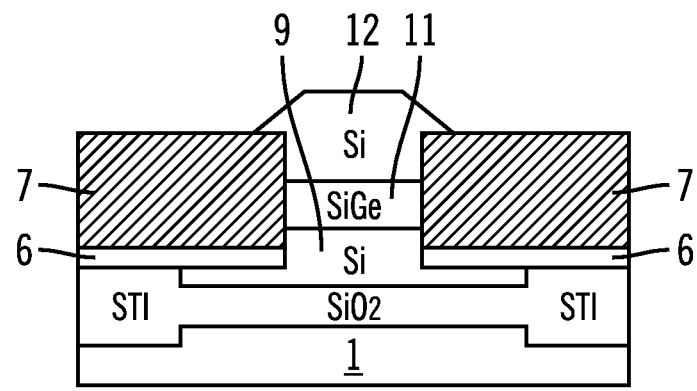
Figure 10:
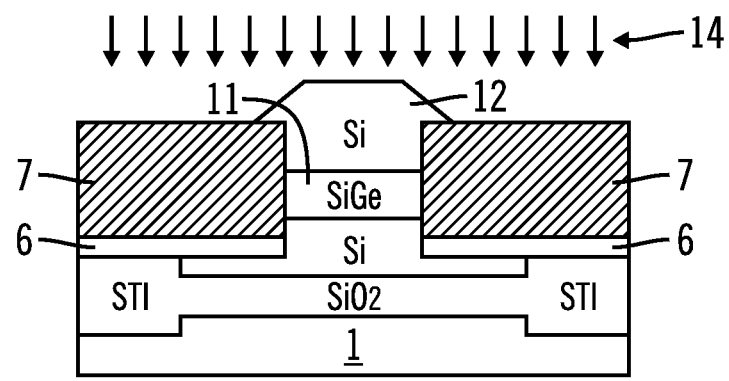

A second silicon layer 12 is then formed by selective epitaxial growth on the silicon-germanium layer 11 so as to fill or overfill the window 8, as shown in FIG. 9. This is followed by implantation, as shown in FIG. 10, using a high does of arsenic or phosphorus 14 (for the exemplary n-channel transistor) so as to dope the second silicon layer 12 and form the drain region of the transistor. Diffusion of dopants from the drain toward the silicon-germanium layer 11 is not a problem because, as explained in more detail below, the silicon-germanium layer 11 is subsequently removed.

Figure 11:
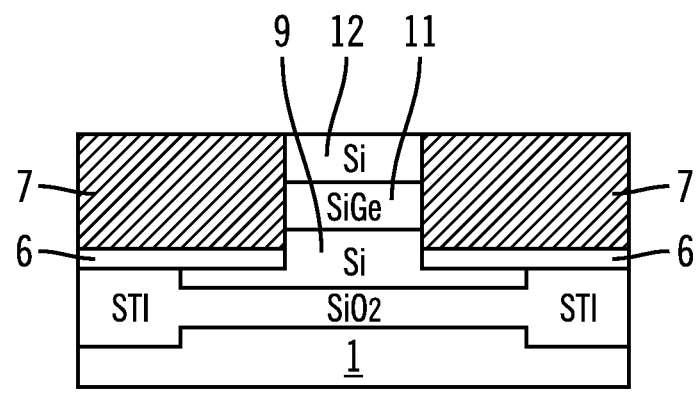

As shown in FIG. 11, the second silicon layer 12 is planarized, for example, by chemical mechanical polishing (CMP). This planarization is optional, as the remainder of the fabrication process can also accommodate a non-planarized pillar.

Figure 12:
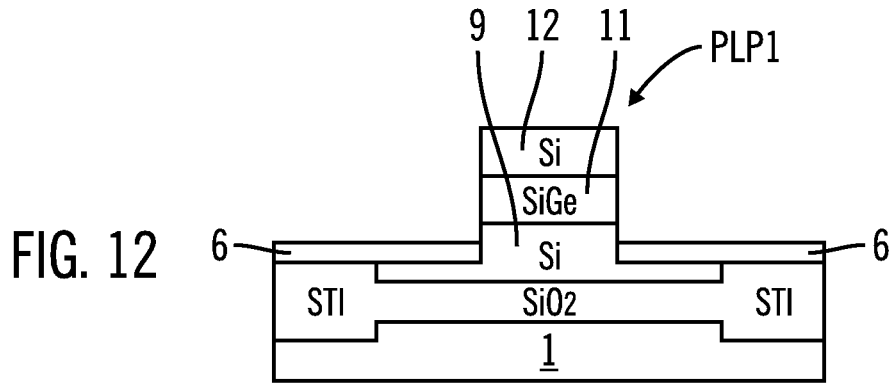

In the next step, the silicon nitride layer 7 of the dielectric block is removed, for example by conventional chemical etching. There is then obtained a stack PLP1 including the first silicon layer 9, the silicon-germanium layer 11, and the planarized second silicon layer 12, as shown in FIG. 12.

Figure 13:
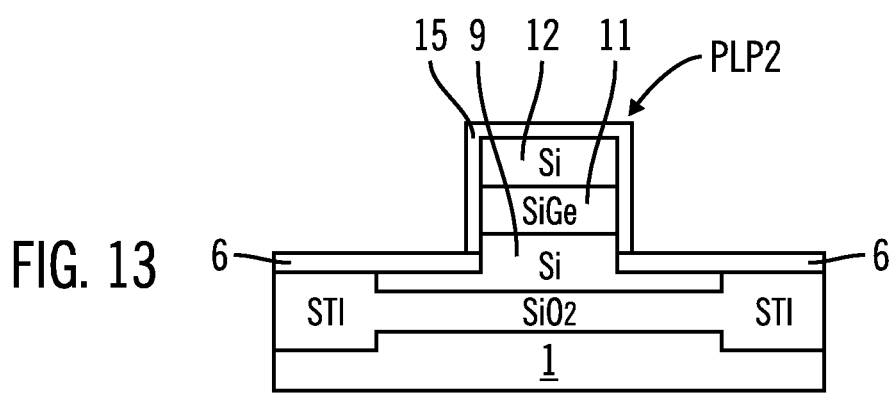

The process then continues, as shown in FIG. 13, with epitaxial growth of silicon that is selective with respect to the oxide layer 6. In other words, a surface silicon layer 15 is formed on the stack PLP1 by selective epitaxial growth, to obtain a primary pillar PLP2. The thickness of the epitaxially grown layer 15 will define the thickness of the connecting semiconductor regions within which the conduction channels of the vertical transistor will be situated. Consequently, the thicknesses of the two channel regions of the transistor are not fixed by a photolithographic resolution but by a step of epitaxial growth, which enables very fine thicknesses to be obtained, typically on the order of a few tens of nanometers, for example 20 nanometers, or even less.

The thickness of the pedestal oxide layer 6 is adjusted so that it is not entirely consumed by successive etching and interface cleaning operations. For example, a thickness on the order of 20 nanometers is chosen.

Figure 14:
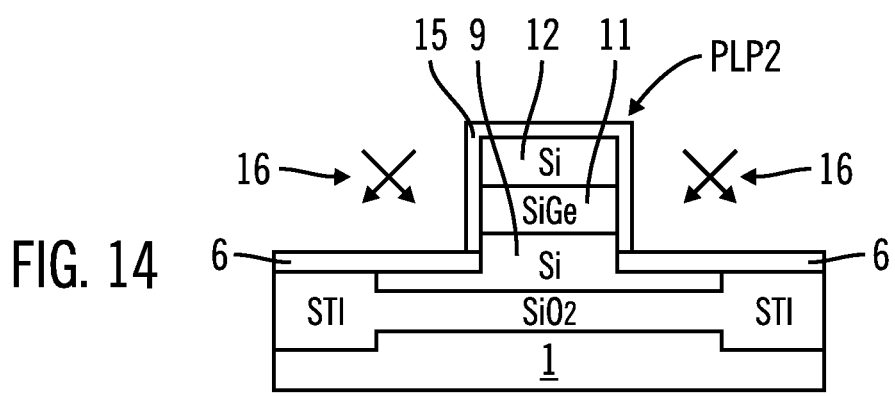

The channel of the transistor, consisting of the flanks of the surface silicon layer 15, is then implanted with boron 16, as shown in FIG. 14, through a tilted implantation at a low dose and a high energy. There is no risk of compensating the source and drain regions with such an implant because the dopant concentration of those regions is two orders of magnitude or more greater than that of the channel.

Figure 15:
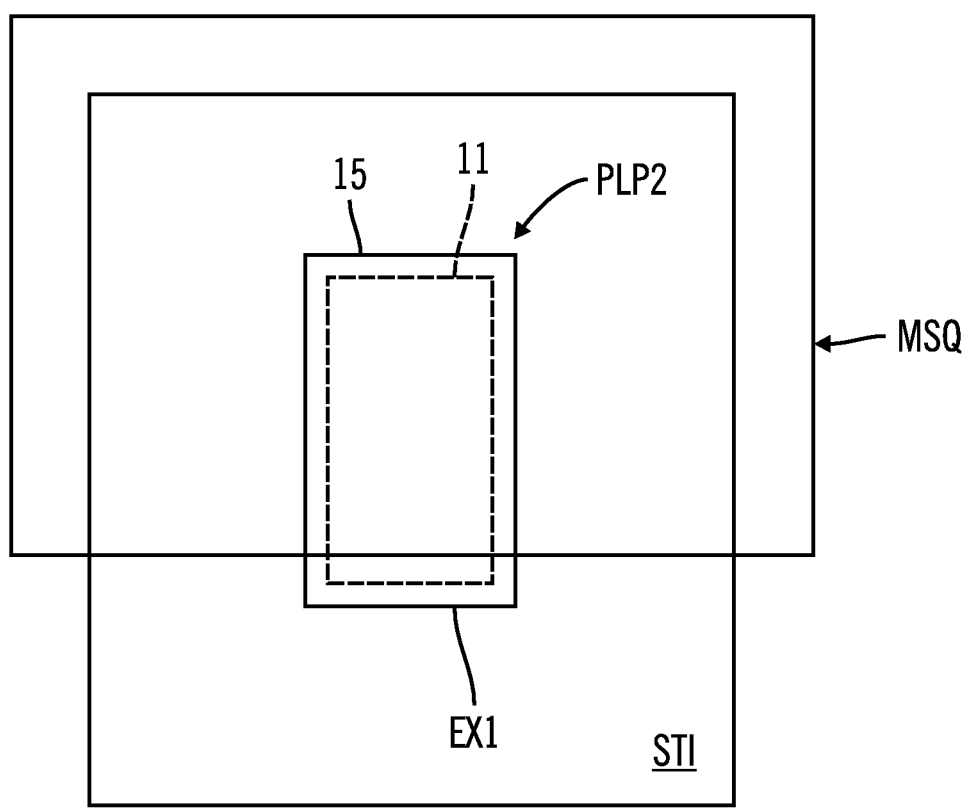
Figure 16:
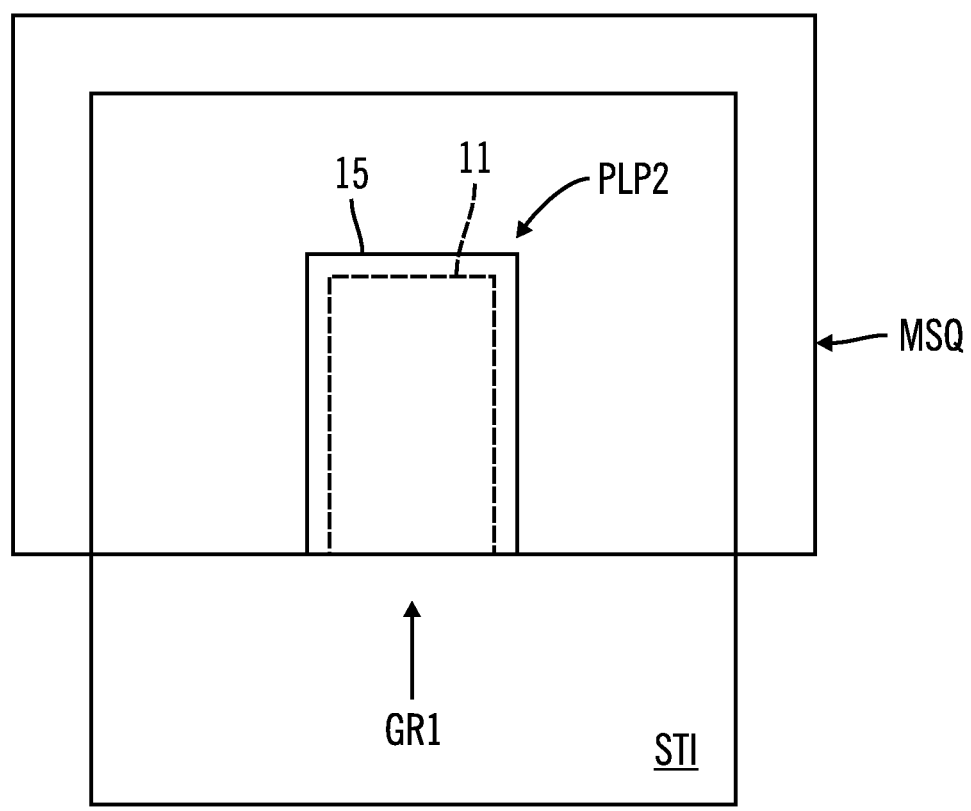

At this stage of the process, the primary pillar PLP2 consists of two layers of silicon 9 and 12 around a silicon-germanium core 11. The subsequent steps remove the silicon-germanium core 11 of the pillar PLP2. For this purpose, there is a need to open the primary pillar PLP2 at one end to obtain access to the silicon-germanium layer (core) 11. This is possible, for example, as shown in FIG. 15, by using a mask MSQ to protect the pillar PLP2 over its length while exposing only one of its ends EX1 for etching. This is followed by selective etching, as shown in FIG. 16. The etching is selective with respect to silicon and with respect to silicon oxide. This selective etching can be effected either by an oxidizing chemical process (for example, using a solution containing 40 ml of 70% $HNO_3$+20 ml $H_2O_2$+5 ml of 0.5% HF) or by isotropic plasma etching.

Figure 17:
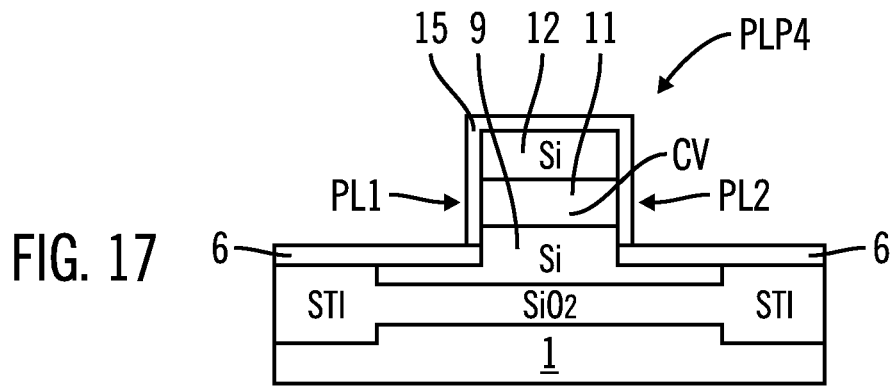

This produces a central cavity CV, as shown in the sectional view of FIG. 17. The pillar PLP4 obtained after this etching has a top drain region 12, a bottom source region 9 and two very thin connecting semiconductor regions PL1 and PL2, which form two ultra fine pillars.

Figure 18:
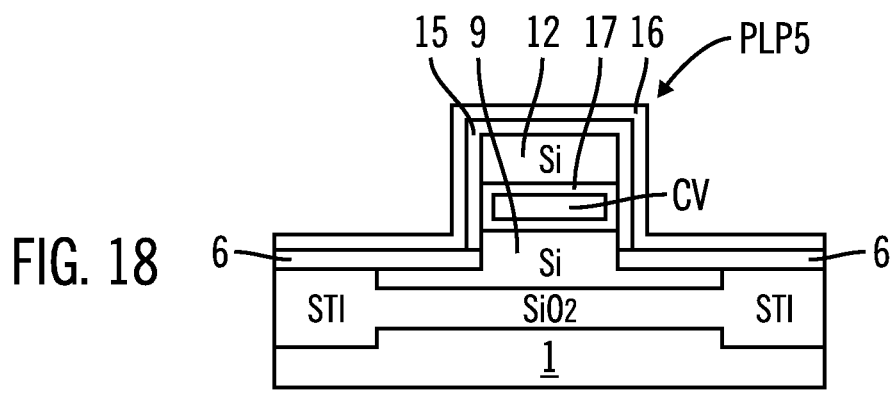

Referring now to FIG. 18, an external isolating layer 16 (for example of silicon dioxide) is formed on the outside surface of the pillar PLP4 and on the pedestal oxide layer 6, together with an internal isolating layer 17 that coats the inside walls of the cavity CV (for example by thermal growth in a furnace).

Figure 19:
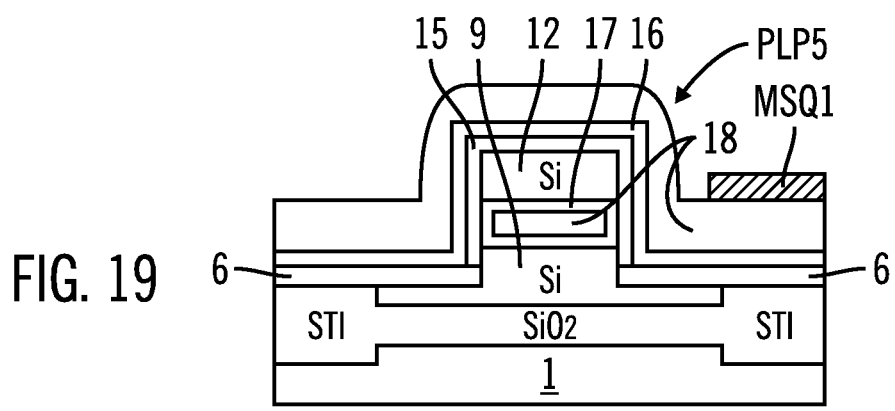

Next, a gate material layer 18 is deposited onto the pillar PLP5 in a known manner, as shown in FIG. 19. This layer 18 also fills the interior of the cavity CV. The gate can be doped in situ during its deposition.

Figure 20:
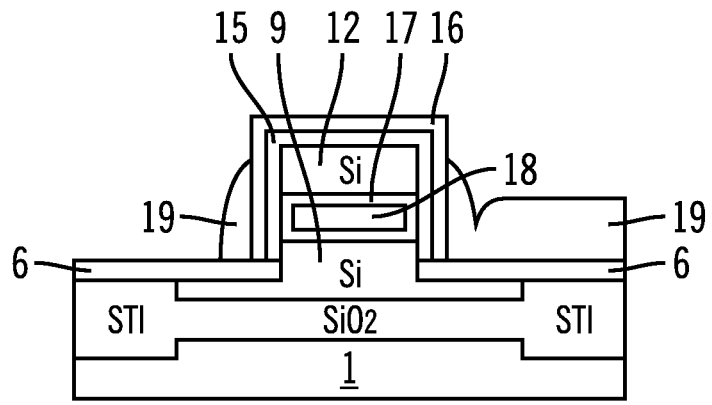

Then, after placing a mask MSQ1 on the gate material on top of the lateral isolating region STI for subsequent formation of a gate contact, the gate material is etched anisotropically, as shown in FIG. 20. This forms the definitive gate region including an external part 19 that contacts the oxide layers 16 and 6 on the external flanks of the pillar, and an internal gate material layer 18 that is isolated from the source and drain regions and from the channel regions by the internal isolating layer 17.

Figure 21:
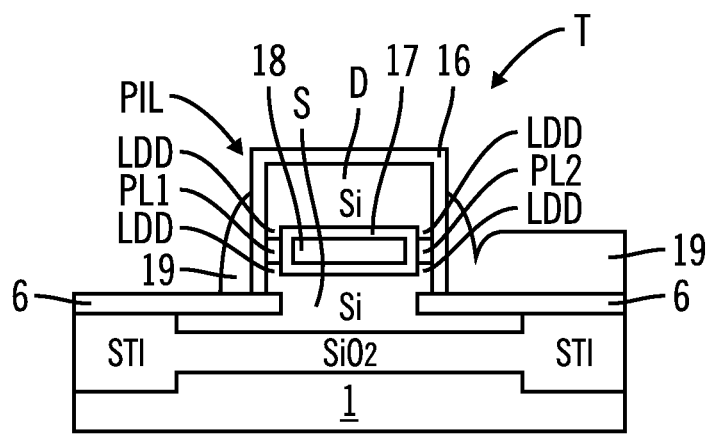

This is followed by annealing to activate the dopants of the source and drain regions and the gate, as shown in FIG. 21. Lightly doped source and drain extension areas LDD are formed by diffusion in each of the connecting semiconductor regions PL1 and PL2. If a metal gate is used, the source and drain region dopants can be annealed earlier in the process (for example, after the tilted implantation of the channels).

As shown in FIG. 21, the transistor according to this embodiment of the present invention includes, on a semiconductor substrate 1, a vertical pillar PIL having a drain region D at the top. The transistor further includes a gate dielectric layer 16 situated on the flanks of the pillar. The source region S is in the bottom part of the pillar and is electrically isolated from the substrate 1 by the $SiO_2$ layer spanning between the lateral isolation areas STI. The insulated gate has an isolated external portion 19 that contacts the flanks of the pillar PIL and an isolated internal gate material layer 18 situated inside the pillar, between the source and drain regions. The isolated internal gate material layer 18 is laterally separated from the isolated external portion 19 by two connecting semiconductor regions PL1 and PL2 extending between the source and drain regions.

Figure 22:
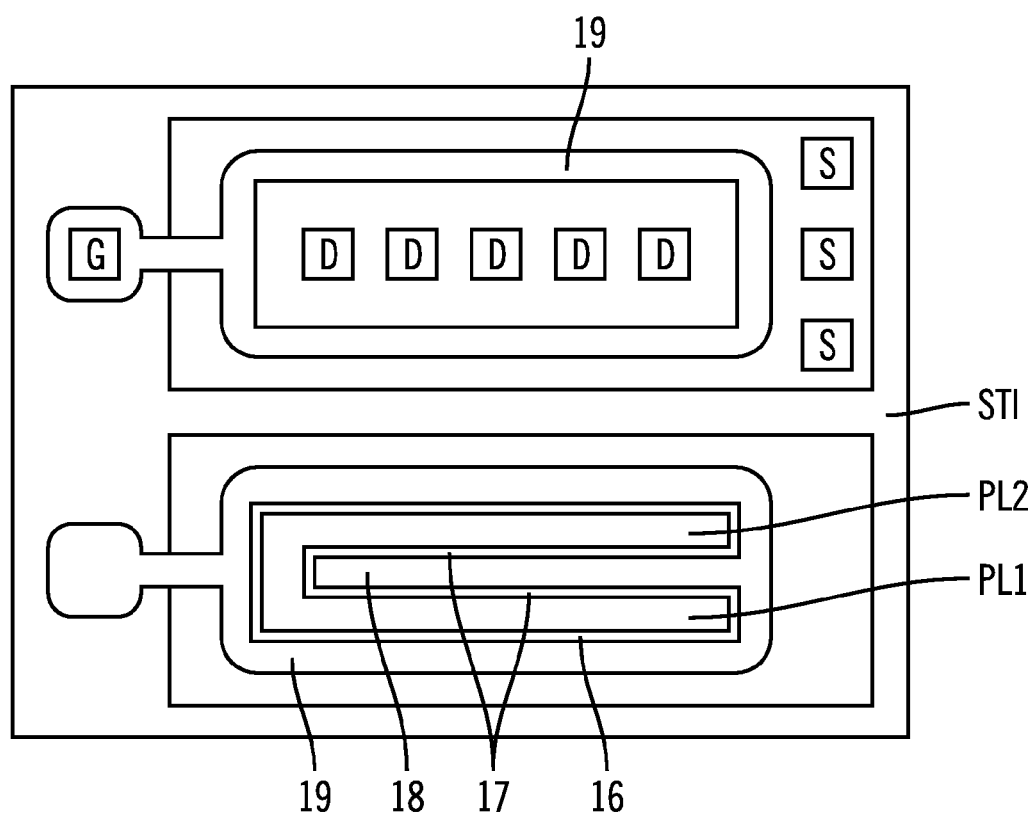

The upper part of FIG. 22 is a plan view of the structure of FIG. 21, showing the source S, drain D, and gate G contacts of this embodiment. The bottom part of FIG. 22 is a sectional view at the level of the isolated internal gate material layer 18 of the gate.

As shown, the transistor has four conduction channels functioning over the two connecting semiconductor regions PL1 and PL2. In each region PL1 and PL2, the two conduction channels are respectively situated along the external isolating layer 16 and along the internal isolating layer 17.

Furthermore, the use of very thin regions PL1 and PL2 allows the integration of a single "mid-gap" gate (for example of metal or P-doped germanium). In the case of a metal gate, the source and drain regions can easily be silicided. A "mid-gap" gate is formed of a material whose Fermi level coincides more or less with the intrinsic Fermi level of silicon.

Accordingly, due to the formation of very thin semiconductor regions PL1 and PL2, embodiments of the present invention provide a transistor in which the double gate mode of operation is obtained, which is the most favorable mode of operation for controlling the effects of short channels. Also, because the two connecting semiconductor regions PL1 and PL2 are formed in parallel, the current $I_{on}$ is quadrupled rather than doubled, as in a conventional vertical transistor.

The transistor also simultaneously produces very thin source and drain extension areas by simple diffusion, so as to significantly reduce the series resistances, because the source and the drain regions are still wide compared to the regions PL1 and PL2. The widening of the drain also enables particularly easy contact, which would not have been the case if the whole of the pillar had been made thinner.

The transistor is entirely compatible with the process described in French Patent Application Number 01 04436, filed Apr. 2, 2001, entitled "A Method of Fabricating a Vertical Insulated Gate Transistor With Low Overlap of the Gate On the Source and the Drain, and an Integrated Circuit Including This Kind of Transistor," which is incorporated herein by reference. In particular, the gate/source and gate/drain overlap capacitances can be significantly reduced by producing dielectric cavities in the spacers 19 of the external gate, with those dielectric cavities respectively facing the source and drain regions. In this case, the external gate 19 has a first region contacting the gate dielectric layer 16 and a second region facing the source and drain regions and separated from those regions by dielectric cavities. The first region is formed of a silicon-germanium alloy and the second region is formed of silicon, for example.

To form the external insulated gate region, this embodiment includes the deposition on the layer 16 of a semiconductor stack including, for example, a silicon-germanium alloy on top of which is silicon, for example, followed by anisotropic etching to form the gate spacers resting on the flanks of the pillar, and then partial selective etching of the silicon-germanium with respect to the silicon to form the cavities. The cavities are then filled with a dielectric material, for example silicon dioxide, by oxidation or deposition.

Accordingly, embodiments of the present invention provide a vertical quadruple conductive channel insulated gate transistor and method for manufacturing the same. This transistor advantageously has a source region that is always electrically isolated from the substrate, regardless of the conductivity types of the source and the substrate. Thus, transistors according to the present invention are advantageously dielectrically isolated from the substrate, as opposed to the conventional transistor described above that is either not isolated or only junction isolated.

The present invention is particularly suited for high-speed logic circuits and radio-frequency circuits utilizing transistors with isolated sources.

The terms "a" or "an", as used herein, are defined as one or more than one. The term plurality, as used herein, is defined as two or more than two. The term another, as used herein, is defined as at least a second or more. The terms including and having, as used herein, are defined as comprising (i.e., open language). The term coupled, as used herein, is defined as connected, although not necessarily directly, and not necessarily mechanically.

Although a specific embodiment of the invention has been disclosed, it will be understood by those having skill in the art that changes can be made to this specific embodiment without departing from the spirit and scope of the invention. The invention is not limited to the embodiments that have just been described, but embraces all variants thereof. Accordingly, although there is described here the formation of the primary pillar stack by selective epitaxial growth in a window in a dielectric block, the pillar could be formed by etching a stack grown epitaxially on the substrate. The scope of the invention is not to be restricted, therefore, to the specific embodiment, and it is intended that the appended claims cover any and all such applications, modifications, and embodiments within the scope of the present invention.

What is claimed is:

1. A method of fabricating a vertical insulated gate transistor on a semiconductor substrate, the method comprising the steps of:

forming a horizontal isolation region in the semiconductor substrate, the horizontal isolation region separating and electrically isolating an upper portion of the semiconductor substrate from a lower portion of the semiconductor substrate;

forming a vertical semiconductor pillar with one or more flanks and a cavity, the pillar resting on the upper portion of the semiconductor substrate; and forming a dielectrically isolated gate, the gate including an internal portion within the cavity and an external portion resting on the flanks of the pillar and on the upper portion of the semiconductor substrate, wherein the step of forming the gate includes coating one or more internal walls of the cavity with an isolating layer and filling the cavity with a gate material so as to form the internal portion of the gate within the cavity and the external portion of the gate that rests on the flanks of the pillar, and to form two connecting semiconductor regions extending between a source region and a drain region of the transistor.

2. The method according to claim 1, wherein the step of forming the horizontal isolation region includes:

forming lateral isolation areas in the substrate so as to delimit at least one active substrate area;

implanting a dopant into at least the active substrate area; and annealing the substrate so that the horizontal isolation region completely spans the one active substrate area.

3. The method according to claim 2, wherein the dopant is oxygen or nitrogen.

4. The method according to claim 1, wherein the step of forming the pillar includes:

forming a stack including a first layer of a first semiconductor material, a second layer of a second semiconductor material that can be selectively removed with respect to the first semiconductor material, and a third layer of the first semiconductor material;

forming a surface semiconductor layer of the first material on the stack; and selectively etching the second layer of the stack to form the cavity.

5. The method according to claim 4, wherein the forming of the stack comprises forming the stack by selective epitaxial growth inside a window formed in a dielectric block resting on the upper portion of the semiconductor substrate, the window opening onto the upper portion of the semiconductor substrate, and the forming of the surface semiconductor layer comprises removing the dielectric block and selectively growing epitaxially the surface semiconductor layer on the stack.

6. The method according to claim 4, wherein the first semiconductor material is silicon and the second semiconductor material is an alloy of silicon and germanium.

7. The method according to claim 4, the step of forming the pillar comprises epitaxially growing the three layers on the upper portion of the semiconductor substrate and then anisotropically etching the epitaxially grown layers, and the forming of the surface semiconductor layer comprises selectively epitaxially growing the semiconductor surface layer on the stack.

8. A method of fabricating a vertical insulated gate transistor on a semiconductor substrate, the method comprising the steps of:

forming lateral isolation areas in the substrate so as to delimit at least one active substrate area;

forming a horizontal isolation region in the semiconductor substrate, the horizontal isolation region completely spanning the active substrate area so as to separate and electrically isolate an upper portion of the semiconductor substrate from a lower portion of the semiconductor substrate;

forming a vertical semiconductor pillar with one or more flanks and a cavity, the pillar resting on the upper portion of the semiconductor substrate; and forming a dielectrically isolated semiconductor gate, the gate including an internal portion within the cavity and an external portion resting on the flanks of the pillar and on the upper portion of the semiconductor substrate, wherein the step of forming the pillar includes:

forming a stack that includes a first layer of a first semiconductor material, a second layer of a second semiconductor material that can be selectively removed with respect to the first material, and a third layer of the first semiconductor material;

forming a surface semiconductor layer of the first material on the stack; and selectively etching the second layer of the stack to form the cavity, and the step of forming the gate includes coating one or more internal walls of the cavity with an isolating layer and filling the cavity with a gate material so as to form the internal portion of the gate within the cavity and the external portion of the gate that rest on the flanks of the pillar, and to form two connecting semiconductor regions extending between a source region and a drain region of the transistor.

9. The method according to claim 8, wherein the step of forming the horizontal isolation region includes:

implanting a dopant into at least the active substrate area; and annealing the substrate so that the horizontal isolation region completely spans the one active substrate area.

10. The method according to claim 9, wherein the dopant is oxygen or nitrogen.

11. The method according to claim 8, wherein the first semiconductor material is silicon and the second semiconductor material is an alloy of silicon and germanium.

12. The method according to claim 8, wherein the forming of the stack comprises forming the stack by selective epitaxial growth inside a window formed in a dielectric block resting on the upper portion of the semiconductor substrate, the window opening onto the upper portion of the semiconductor substrate, and the forming of the surface semiconductor layer comprises removing the dielectric block and selectively growing epitaxially the surface semiconductor layer on the stack.

13. The method according to claim 12, wherein the step of forming the gate includes:

forming an external isolating layer on the pillar and an internal isolating layer on the one or more internal walls of the cavity;

depositing the gate material on the external isolating layer and in the cavity; and anisotropically etching the gate material.

14. The method according to claim 12, wherein the surface semiconductor layer has a thickness of less than 70 nanometers.

15. The method according to claim 12, further comprising the step of annealing activate dopants of the source region and the drain region so as to form source and drain extension areas in a portion of the semiconductor connecting regions.

16. The method according to claim 8, wherein the step of forming the pillar comprises epitaxially growing the three layers on the upper portion of the semiconductor substrate and then anisotropically etching the epitaxially grown layers, and the forming of the surface semiconductor layer comprises selectively epitaxially growing the semiconductor surface layer on the stack.

17. An integrated circuit including at least one vertical insulated gate transistor formed on a semiconductor substrate, the transistor comprising:
the semiconductor substrate;
a horizontal isolation region located in the semiconductor substrate, the horizontal isolation region separating and electrically isolating an upper portion of the semiconductor substrate from a lower portion of the semiconductor substrate;
a vertical pillar with one or more flanks, an upper portion, a central portion, and a lower portion, one of a source region and a drain region being located in the upper portion of the pillar and the other of the source region and the drain region being located in the lower portion of the pillar;
a gate dielectric layer situated on the flanks of the pillar and on the upper portion of the semiconductor substrate; and
a dielectrically isolated gate, the gate including an internal portion within the central portion of the pillar and an external portion resting on the flanks of the pillar and on the upper portion of the semiconductor substrate,
wherein the internal portion of the gate is laterally separated from the external portion by two connecting semiconductor regions that extend between the source region and the drain region.

18. Then integrated circuit according to claim 17,
further comprising lateral isolation areas in the substrate that delimit at least one active substrate area,
wherein the horizontal isolation region completely spans the one active substrate area.

19. Then integrated circuit according to claim 18, wherein the horizontal isolation region is formed of silicon dioxide or silicon nitride.

20. The integrated circuit according to claim 17, wherein at least one of the connecting semiconductor regions incorporates at least one of a source extension area and a drain extension area.

21. The integrated circuit according to claim 17, wherein the external portion of the gate includes one or more dielectric cavities facing the source and drain regions.

* * * * *